(12) United States Patent
Kim et al.

(10) Patent No.: US 10,598,963 B2
(45) Date of Patent: Mar. 24, 2020

(54) DISPLAY DEVICE HAVING AN INTEGRATED TYPE SCAN DRIVER

(71) Applicant: LG Display Co., Ltd., Seoul (KR)

(72) Inventors: In-June Kim, Paju-si (KR); Myung-Ho Ban, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 133 days.

(21) Appl. No.: 15/824,811

(22) Filed: Nov. 28, 2017

(65) Prior Publication Data

US 2018/0149889 A1    May 31, 2018

(30) Foreign Application Priority Data

Nov. 30, 2016   (KR) .................. 10-2016-0161279

(51) Int. Cl.
| | |
|---|---|
| G02F 1/01 | (2006.01) |
| G11C 19/28 | (2006.01) |
| G09G 3/3266 | (2016.01) |
| G09G 3/22 | (2006.01) |
| G09G 3/36 | (2006.01) |

(52) U.S. Cl.
CPC ............ *G02F 1/0121* (2013.01); *G09G 3/22* (2013.01); *G09G 3/3266* (2013.01); *G11C 19/28* (2013.01); *G09G 3/3677* (2013.01); *G09G 2300/0408* (2013.01); *G09G 2300/0413* (2013.01); *G09G 2310/0264* (2013.01); *G09G 2310/0267* (2013.01); *G09G 2310/0286* (2013.01)

(58) Field of Classification Search
CPC ..... G02F 1/0121; G11C 19/28; G09G 3/3266; G09G 3/22; G09G 3/3677; G09G 2310/0264; G09G 2300/0408; G09G 2310/0286; G09G 2310/0267; G09G 2300/0413; G09G 3/3685; G09G 3/3674; G09G 3/3275; G09G 3/20
See application file for complete search history.

(56) References Cited

U.S. PATENT DOCUMENTS

| | | | |
|---|---|---|---|
| 6,594,606 B2 | 7/2003 | Everitt | |
| 7,167,406 B2 | 1/2007 | Komiya | |
| 7,535,521 B2* | 5/2009 | Kim | ................ G02F 1/136204 349/139 |
| 8,749,469 B2 | 6/2014 | Iwamoto et al. | |
| 9,064,466 B2* | 6/2015 | Lin | ...................... G09G 3/3611 |
| 9,106,209 B2* | 8/2015 | Kang | ................... G09G 3/3677 |

(Continued)

FOREIGN PATENT DOCUMENTS

TW    I349922 B    10/2011

OTHER PUBLICATIONS

Extended European Search Report, dated Nov. 24, 2017, for European Application No. 17193489.6-1914, 11 pages.

*Primary Examiner* — Grant Sitta
(74) *Attorney, Agent, or Firm* — Seed Intellectual Property Law Group LLP

(57) ABSTRACT

A display device including an integrated type scan driver is provided. The integrated type scan driver includes a plurality of main stages connected to corresponding scan lines and disposed on a display panel. The integrated type scan driver further includes at least one dummy stage to which load of an output terminal is applied. Thus, ripple of a Q node is reduced in the dummy stage, thereby delaying multiple outputs of the main stages.

16 Claims, 7 Drawing Sheets

(56) References Cited

U.S. PATENT DOCUMENTS

| | | | | |
|---|---|---|---|---|
| 2007/0001991 A1* | 1/2007 | Jang | ............. | G09G 3/3677 |
| | | | | 345/100 |
| 2007/0109250 A1* | 5/2007 | Woo | ............. | G09G 3/3677 |
| | | | | 345/100 |
| 2007/0152180 A1* | 7/2007 | Tseng | ............. | G09G 3/3233 |
| | | | | 250/591 |
| 2007/0216634 A1* | 9/2007 | Kim | ............. | G09G 3/3677 |
| | | | | 345/100 |
| 2007/0297559 A1* | 12/2007 | Cho | ............. | G09G 3/3677 |
| | | | | 377/64 |
| 2009/0167668 A1* | 7/2009 | Kim | ............. | G09G 3/3677 |
| | | | | 345/100 |
| 2010/0156474 A1* | 6/2010 | Park | ............. | G09G 3/3677 |
| | | | | 327/108 |
| 2010/0201666 A1 | 8/2010 | Tobita | | |
| 2011/0273417 A1* | 11/2011 | Shin | ............. | G09G 3/20 |
| | | | | 345/211 |
| 2012/0293467 A1* | 11/2012 | Lee | ............. | G09G 3/3677 |
| | | | | 345/204 |
| 2013/0169609 A1* | 7/2013 | Son | ............. | G11C 19/28 |
| | | | | 345/209 |
| 2013/0286316 A1* | 10/2013 | Lee | ............. | G02F 1/13306 |
| | | | | 349/46 |
| 2014/0168044 A1* | 6/2014 | Hu | ............. | G09G 3/3696 |
| | | | | 345/90 |
| 2014/0320466 A1* | 10/2014 | Son | ............. | G09G 3/20 |
| | | | | 345/204 |
| 2014/0354523 A1* | 12/2014 | So | ............. | G09G 3/3677 |
| | | | | 345/100 |
| 2015/0213746 A1 | 7/2015 | Kim et al. | | |
| 2016/0141349 A1* | 5/2016 | Yun | ............. | H01L 27/3272 |
| | | | | 257/40 |
| 2016/0321990 A1* | 11/2016 | Kim | ............. | G09G 3/3233 |
| 2017/0249896 A1* | 8/2017 | Kim | ............. | G09G 3/3225 |

\* cited by examiner

DISPLAY DEVICE HAVING AN INTEGRATED TYPE SCAN DRIVER

CROSS-REFERENCE TO RELATED APPLICATION(S)

This application claims the benefit of Korean Patent Application No. 10-2016-0161279, filed on Nov. 30, 2016, which is hereby incorporated by reference as if fully set forth herein.

BACKGROUND

Technical Field

The present disclosure relates to a display device including main stages of a scan driver disposed on a display panel.

Description of the Related Art

In general, electronic apparatuses such as monitors, TVs, laptops, digital cameras include a display device for realizing an image. For example, the display device may include a liquid crystal display and an organic light emitting diode display.

The display device may include a display panel including a display region in which an image is substantially realized. The display device may further include a data driver for supplying data signals to the display region, and a scan driver for sequentially supplying scan signals. The scan driver may be of a gate in panel (GIP) type. For example, the scan driver may include main stages disposed on the display panel and located outside the display region.

The main stages may be connected to the display region by scan lines. Each main stage may receive a signal from one of the previous main stages thereof and one of the next main stages thereof to operate. For example, an n-th main stage may receive a start signal from an (n−3)-th main stage and receive a reset signal from an (n+3)-th main stage. For example, the scan driver may include at least one top dummy stage for supplying a start signal to main stages relatively located at a front side and at least one bottom dummy stage for supplying a reset signal to main stages relatively located at a rear side.

Each of the main stages and at least one dummy stage of the integrated type scan driver may be composed of thin film transistors. For example, each of the main stages and the dummy stage of the integrated type scan driver may include a plurality of thin film transistors.

However, a threshold voltage of the thin film transistor is shifted by repeatedly being turned on and off. For example, the thin film transistors composing the main stages and the dummy stage of the integrated type scan driver may not be stably maintained in the OFF state when the threshold voltage is shifted to a negative value. Therefore, in the display device including the integrated type scan driver, multiple outputs may be undesirably generated in the main stages due to ripple of a Q node.

BRIEF SUMMARY

Accordingly, the present disclosure is directed to a display device having main stages of a scan driver located on a display panel that substantially obviates one or more problems due to limitations and disadvantages of the related art.

An object of the present disclosure is to provide a display device capable of delaying multiple outputs generated by ripple of a Q node in main stages.

Another object of the present disclosure is to provide a display device capable of reducing ripple of a Q node in at least one dummy stage for supplying a start signal or a reset signal to main stages.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, in one embodiment the present disclosure provides a display device that includes: a display panel including a display region, a data driver that supplies data signals to the display region, data lines that connect the data driver to the display region, a scan driver disposed on the display panel and having a plurality of main stages and a first dummy stage, scan lines that connect the main stages of the scan driver to the display region, and a first dummy line positioned outside of the display region and connected to the first dummy stage of the scan driver. The scan driver sequentially supplies scan signals from the main stages to the display region. The dummy line intersects at least one data line.

The first dummy line may be disposed in parallel to the scan lines, and may be positioned between the display region and the data driver.

A length of the first dummy line may be different from that of the scan lines.

The first dummy line may include an end portion located between the data lines.

The first dummy stage may supply a start signal to at least one of the main stages, and the scan driver may further include a second dummy stage that supplies a reset signal to at least one of the main stages. The first dummy line may be positioned adjacent to a first side of the display region, and the second dummy stage may be connected to a second dummy line that is positioned adjacent to a second side of the display region that is opposite to the first side.

The first dummy line and the second dummy line may be disposed in parallel to the scan lines. The data lines may extend through the first side of the display region to at least the second side.

The data lines may extend past the second side of the display region, and the second dummy line may intersect at least one of the data lines.

In another embodiment, the present disclosure provides a display device that includes: a display panel including a display region, a data driver connected to the display region by data lines and positioned adjacent to a first side of the display region, a first scan driver positioned adjacent to a second side of the display region and connected to the display region by first scan lines, and a second scan driver positioned adjacent to a third side of the display region that is opposite to the second side and connected to the display region by second scan lines. The first scan driver and the second scan driver may be positioned on the display panel. At least one first dummy line is located outside the display region and positioned adjacent to a fourth side of the display region that is opposite to the first side. The at least one first dummy line extends between and is connected to the first scan driver and the second scan driver.

The data lines may extend through the display region beyond the fourth side, and the at least one first dummy line may intersect at least one of the data lines.

The display device may include at least one second dummy line connected to the first scan driver and positioned between the data driver and the first side of the display panel, the at least one second dummy line may intersect at least one data line. At least one third dummy line may be connected to the second scan driver and positioned between the data driver and the first side of the display panel, the at least one third dummy line may intersect at least one data line. The at least one second dummy line and the at least one third dummy line may intersect different data lines.

The at least one second dummy line and the at least one third dummy line may be disposed in parallel to the scan lines outside the display region. The at least one second dummy line and the at least one third dummy line may be aligned with each other.

The at least one second dummy line may include a plurality of second dummy lines, the at least one third dummy line may include a plurality of third dummy lines, and a number of the second dummy lines may be equal to a number of the third dummy lines.

The at least one first dummy line may include a plurality of first dummy lines, and a number of the first dummy lines may be equal to the number of second dummy lines and the number of third dummy lines.

The second dummy lines may be aligned with corresponding ones of the third dummy lines.

In yet another embodiment, the present disclosure provides a method of making a display device that includes: positioning a data driver adjacent to a first side of a display region of a display panel; connecting the data driver to data lines that extend into the display region through the first side; positioning a first scan driver on the display panel adjacent to a second side of the display region; connecting the first scan driver to first scan lines that extend into the display region through the second side; positioning a second scan driver on the display panel adjacent to a third side of the display region that is opposite to the second side; connecting the second scan driver to second scan lines that extend into the display panel through the third side; and connecting the first scan driver and the second scan driver to at least one dummy line positioned outside of the display region and adjacent to a fourth side of the display region that is opposite to the first side.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
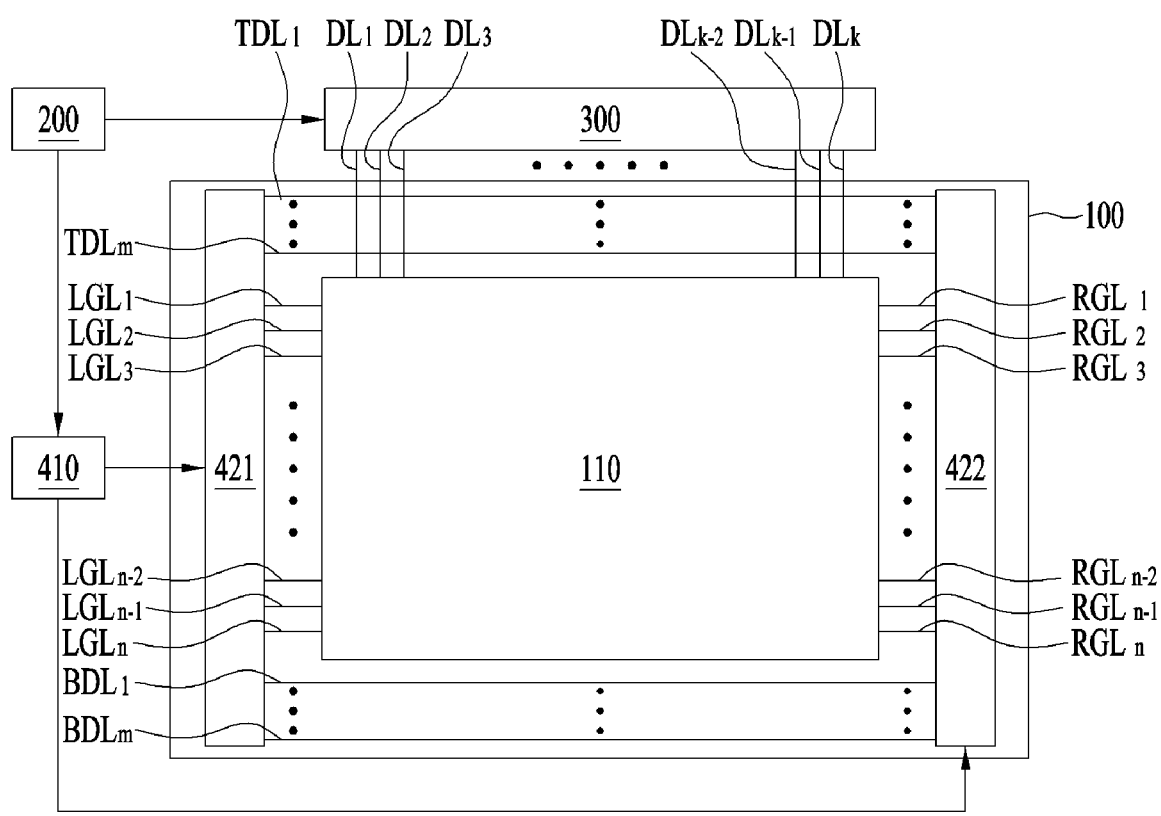
FIG. 1 is a schematic diagram showing a display device according to an embodiment of the present disclosure.

The objects, configurations and advantages of the present disclosure will become apparent with reference to embodiments described below in detail in conjunction with the accompanying drawings. Here, since the embodiments of the present disclosure are provided to sufficiently deliver the technical spirit of the present disclosure to those skilled in the art, the present disclosure may be implemented in another format without being limited to the embodiments specifically described hereinafter.

Throughout the present specification, the same reference numerals designate the same constituent elements. In the drawings, the length and thickness of a layer or region may be exaggerated for convenience of explanation. In addition, if a first element is located "on" or "above" a second element, the first element may directly contact the second element or a third element may be provided between the first element and the second element. Additionally, the term "intersect," as used herein, does not necessarily denote physical contact between elements. For example, if a first element "intersects" or is "intersected by" a second element, the first and second elements may cross over or under each another without physical contact between them.

Since terms such as "first" and "second" may be used to describe various elements, these terms are merely used to distinguish one element from another element and are not intended to designate any order or sequence of the elements. The first element and the second element may be arbitrarily used for convenience of understanding by those skilled in the art without departing from the technical spirit of the present disclosure.

Terms used in this specification are used merely to illustrate specific embodiments and are not intended to limit the present disclosure. For example, a singular representation may include a plural representation unless context clearly indicates otherwise. It will be understood that the terms "including," "having," etc., used in this specification specify the presence of features, numerals, steps, operations, elements or parts described in this specification or a combination thereof and do not exclude presence or addition of one or more additional features, numerals, steps, operations, elements, parts or combinations thereof.

So long as not defined otherwise, all terms used herein including technical terms and scientific terms may have the same meaning as generally understood by an ordinary person skilled in the art to which the present disclosure pertains. In addition, general terms used in the description of the present disclosure should be construed according to definitions in dictionaries or according to context, and should not be construed in an excessively restrained manner unless defined clearly in this specification.

FIG. 1 is a schematic diagram showing a display device according to an embodiment of the present disclosure.

Referring to FIG. 1, the display device may include a display panel 100, a timing controller 200, a data driver 300, a level shifter 410, a first scan driver 421 and a second scan driver 422.

The display panel 100 may include a display region 110 in which an image is implemented, or displayed. The display region 110 may include pixel regions driven according to signals supplied from the data driver 300, the first scan driver 421 and the second scan driver 422. In each pixel region, an element having permeability changed by supplied signals or a light emitting element having luminance changed by supplied signals may be disposed. For example, the display device according to one or more embodiments of the present disclosure may be an organic light emitting display device including a plurality of organic light emitting elements located in the display region 110.

The timing controller 200 may generate and supply timing control signals for controlling operation timings of the data driver 300 and the level shifter 410. For example, the timing controller 200 may generate timing control signals based on timing signals such as a vertical synchronization signal, a horizontal synchronization signal, a data enable signal and a dot clock. For example, the timing controller 200 may receive the timing signals such as the vertical synchronization signal, the horizontal synchronization signal, the data enable signal and the dot clock through a low-voltage differential signaling (LVDS) or a transition-minimized differential signaling (TMDS) interface reception circuit connected to an image board.

The data driver 300 may supply data signals to the display region 110 of the display panel 100. The display region 110 and the data driver 300 may be connected to each other by data lines DL1 to DLk. The display region 110 may receive data signals from the data driver 300 through the data lines DL1 to DLk.

The data driver 300 may include a plurality of source drive integrated circuits (ICs). Each source drive IC may be controlled by the timing control signals received from the timing controller 200. For example, the timing controller 200 may supply digital video data and a source timing control signal to each source drive IC. Each source drive IC may convert the digital video data into gamma voltages according to the source timing control signal, and generate the data signals.

The data driver 300 may be disposed outside of the display panel 100, as shown. For example, the data driver 300 may be connected to the data lines DL1 to DLk located on the display panel 100 by a chip on glass (COF) or tape automated bonding (TAB) method.

The level shifter 410 may shift the levels of clock signals, reset clock signals and start signals under control of the timing controller 200 and supply the signals having the shifted levels to the first scan driver 421 and the second scan driver 422. The first scan driver 421 and the second scan driver 422 may sequentially supply the scan signals to the display region 110 based on the signals received from the level shifter 410.

The display device according to the embodiment shown in FIG. 1 is described as having the level shifter 410 located outside the display panel 100. However, a display device according to various embodiments of the present disclosure may include a level shifter 410 disposed on the display panel 100.

The first scan driver 421 and the second scan driver 422 may supply scan signals to the display region 110 of the display panel 100. The display region 110 and the first scan driver 421 may be connected to each other by first scan lines LGL1 to LGLn. The display region 110 and the second scan driver 422 may be connected by second scan lines RGL1 to RGLn. The display region 110 may sequentially receive the scan signals through the first scan lines LGL1 to LGLn and the second scan lines RGL1 to RGLn.

The first scan driver 421 and the second scan driver 422 may be disposed on the display panel 100. The first scan driver 421 and the second scan driver 422 may be located outside the display region 110. The second scan driver 422 may be spaced apart from the first scan driver 421. For example, the display region 110 may be disposed between the first scan driver 421 and the second scan driver 422.

In the display region 110, the data lines DL1 to DLk may intersect the first scan lines LGL1 to LGLn or the second scan lines RGL1 to RGLn, and the pixel regions are formed at or near respective intersections of the data lines and scan lines. The second scan lines RGL1 to RGLn may be disposed side by side with respect to the first scan lines LGL1 to LGLn. For example, the number of second scan lines RGL1 to RGLn may be equal to the number of first scan lines LGL1 to LGLn, and the first scan lines LGL1 to LGLn may be formed across a first side, such as the left side, of the display region 110, while the second scan lines may be formed across a second side, such as the right side, of the display region 110. The structure of the second scan driver 422 may be equal to or the same that of the first scan driver 421. The number of the first scan lines LGL1 to LGLn and the number of second scan lines RGL1 to RGLn may be different from the number of data lines DL1 to DLk.

In the display device according to one or more embodiments of the present disclosure, the second scan lines RGL1 to RGLn are separated from the first scan lines LGL1 to LGLn. However, in a display device according to another embodiment of the present disclosure, the second scan lines RGL1 to RGLn may be connected to the first scan lines LGL1 to LGLn, which are disposed side by side with respect to the corresponding second scan lines LGL1 to LGLn. That is, each of the second scan lines RGL1 to RGLn, which may be formed across one side of the display region 110, may be connected to a corresponding first scan line LGL1 to LGLn, which may be formed across an opposite side of the display region 110. For example, in a display device according to another embodiment of the present disclosure, the first scan driver 421 and the second scan driver 422 may be connected by the first scan lines LGL1 to LGLn and the second scan lines RGL1 to RGLn.

Figure 2:
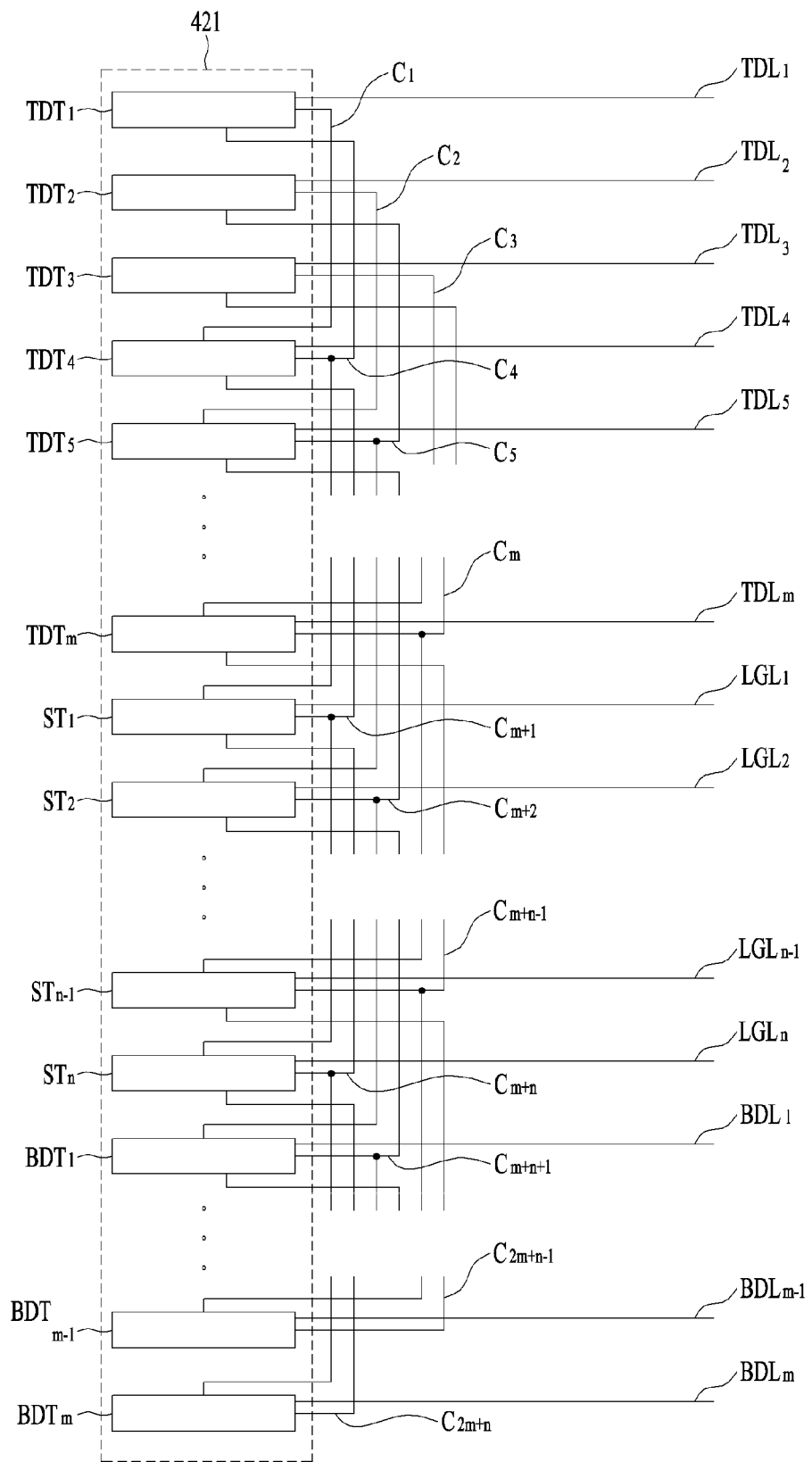
FIG. 2 is a schematic diagram showing a scan driver of a display device according to an embodiment of the present disclosure.

FIG. 2 is a schematic diagram showing the first scan driver 421 of the display device according to an embodiment of the present disclosure.

Referring to FIGS. 1 and 2, the first scan driver 421 of the display device may include a plurality of stages, including top dummy stages TDT1 to TDTm, main stages ST1 to STn, and bottom dummy stages BDT1 to BDTm. As used herein, the term "dummy stage" refers to a stage of a scan driver that does not output a scan signal to a corresponding scan line in the display region 110. Instead, the dummy stages, which may have a same or similar construction and functionality as the main stages, may be coupled to dummy lines which are provided outside of the display region 110. Further, the terms "top dummy stage" and "bottom dummy stage" are used only for ease of description of the various embodiments provided by this disclosure, and are not intended to limit the embodiments to any particular orientation. Instead, "top dummy stage" refers to a dummy stage that is positioned in a first region (e.g., an upper region, as shown in FIG. 1) of the display panel 100, and "bottom dummy stage" refers to a dummy stage that is positioned in a second region (e.g., a lower region, as shown in FIG. 1) of the display panel 100 that is opposite to the first region.

The main stages ST1 to STn may be disposed between the top dummy stages TDT1 to TDTm and the bottom dummy stages BDT1 to BDTm. Each of the main stages ST1 to STn may be connected to one of the first scan lines LGL1 to LGLn. For example, the number of main stages ST1 to STn may be equal to the number of first scan lines LGL1 to LGLn.

The main stages ST1 to STn may receive a signal from one of the previous stages TDT1 to TDTm, ST1 to STn and BDT1 to BDTm and one of the next stages TDT1 to TDTm, ST1 to STn and BDT1 to BDTm, and operates based at least in part on the received signals from the previous stage and the next stage. For example, the main stages ST1 to STn may include a first output terminal connected to the scan lines LGL1 to LGLn and a second output terminal connected to the other stages TDT1 to TDTm, ST1 to STn and BDT1 to BDTm through carrier lines C1 to Cn+2m. Accordingly, each of the main stages ST1 to STn may output a respective scan signal to a respective scan line LGL1 to LGLn via the first output terminal, and may output signals to a previous stage and to a next stage via the carrier line connected to the second output terminal.

The display device according to the embodiment shown in FIG. 2 is described such that each of the main stages ST1 to STn includes two output terminals. However, in a display device according to various other embodiments of the present disclosure, each of the main stages ST1 to STn may include a single output terminal. For example, the carrier lines C1 to C2m+n of the display device according to embodiments of the present disclosure may be connected to the corresponding scan lines LGL1 to LGLn, such that a single output of the main stages ST1 to STn is provided to a corresponding scan line LGL1 to LGLn and to a corresponding carrier line C1 to C2m+n.

A first portion of the main stages ST1 to STn, which may be positioned in an upper half of the display panel 100 and relatively near to the top dummy stages, may receive signals from respective ones of the top dummy stages TDT1 to TDTm. A second portion of the main stages ST1 to STn, which may be positioned in a lower half of the display panel 100 and relatively near to the bottom dummy stages, may receive signals from respective ones of the bottom dummy stages BDT1 to BDTm. The number of bottom dummy stages BDT1 to BDTm may be equal to the number of top dummy stages TDT1 to TDTm. The number of top dummy stages TDT1 to TDTm and the number of bottom dummy stages BDT1 to BDTm may be different from the number of main stages ST1 to STn.

The top dummy stages TDT1 to TDTm and the bottom dummy stages BDT1 to BDTm may have the same structure as the main stages ST1 to STn. For example, each of the top dummy stages TDT1 to TDTm and the bottom dummy stages BDT1 to BDTm may include two output terminals. The scan lines LGL1 to LGLn may not be connected to the output terminals of the top dummy stages TDT1 to TDTm or to the output terminals of the bottom dummy stages BDT1 to BDTm.

The top dummy lines TDL1 to TDLm may be connected to the output terminals of the top dummy stages TDT1 to TDTm, respectively, which are not connected to the carrier lines C1 to C2m+n. The bottom dummy lines BDL1 to BDLm may be connected to the output terminals of the bottom dummy stages BDT1 to BDTm, which are not connected to the carrier lines C1 to C2m+n.

The top dummy lines TDL1 to TDLm and the bottom dummy lines BDL1 to BDLm may be disposed on the display panel 100. The top dummy lines TDL1 to TDLm and the bottom dummy lines BDL1 to BDLm may be located outside of the display region 110 on the display panel 100. For example, the display region 110 may be disposed between the top dummy lines TDL1 to TDLm and the bottom dummy lines BDL1 to BDLm.

The top dummy lines TDL1 to TDLm and the bottom dummy lines BDL1 to BDLm may be positioned such that they are parallel to the first scan lines LGL1 to LGLn and the second scan lines RGL1 to RGLn. The top dummy lines TDL1 to TDLm may be disposed between the display region 110 and the data driver 300. The top dummy lines TDL1 to TDLm may intersect the data lines DL1 to DLk.

The top dummy lines TDL1 to TDLm and the bottom dummy lines BDL1 to BDLm may be connected between the first scan driver 421 and the second scan driver 422. For example, each of the top dummy stages TDT1 to TDTm of the first scan driver 421 may be connected to a corresponding top dummy stage TDT1 to TDTm of the second scan driver 422 by one of the top dummy lines TDL1 to TDLm. Similarly, each of the bottom dummy stages BDT1 to BDTm of the first scan driver 421 may be connected to a corresponding bottom dummy stage BDT1 to BDTm of the second scan driver 422 by one of the bottom dummy lines BDL1 to BDLm.

In the display device according to one or more embodiments of the present disclosure, the carrier lines C1 to C2m+n and the dummy lines TDL1 to TDLm and BDL1 to BDLm may be connected to the output terminals of the dummy stages TDT1 to TDTm and BDT1 to BDTm. As shown in FIG. 2, each of the dummy stages TDT1 to TDTm and BDT1 to BDTm may include two separate output terminals, with a respective dummy line connected to one of the output terminals, and a respective carrier line connected to the other output terminal. The dummy lines TDL1 to TDLm and BDL1 to BDLm may be connected between the corresponding dummy stages TDT1 to TDTm and BDT1 to BDTm of the two scan drivers 421 and 422. In addition, the top dummy lines TDL1 to TDLm may intersect the data lines DL1 to DLk, so that the top dummy stages TDT1 to TDTm may be coupled to a parasitic capacitance via the top dummy lines TDL1 to TDLm. Thus, load by the dummy lines TDL1 to TDLm and BDL1 to BDLm may be applied to the output terminals of the dummy stages TDT1 to TDTm and BDT1 to BDTm.

Figure 3:
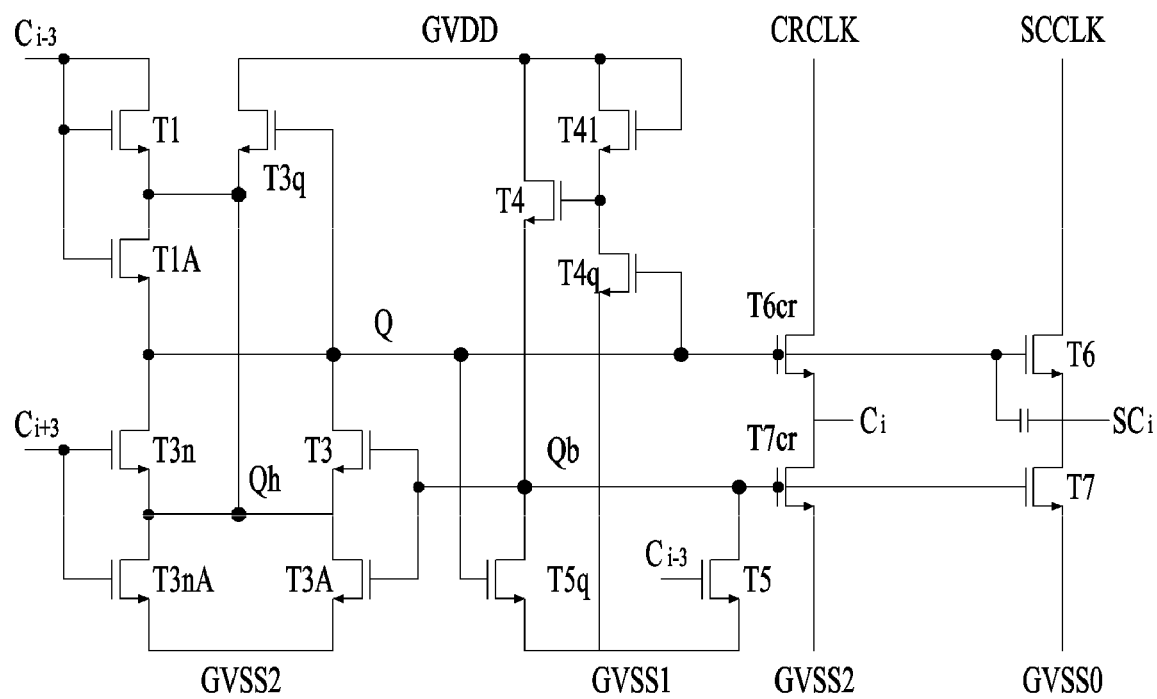
FIG. 3 is a circuit diagram showing an i-th stage of a display device according to an embodiment of the present disclosure.
Figure 4:
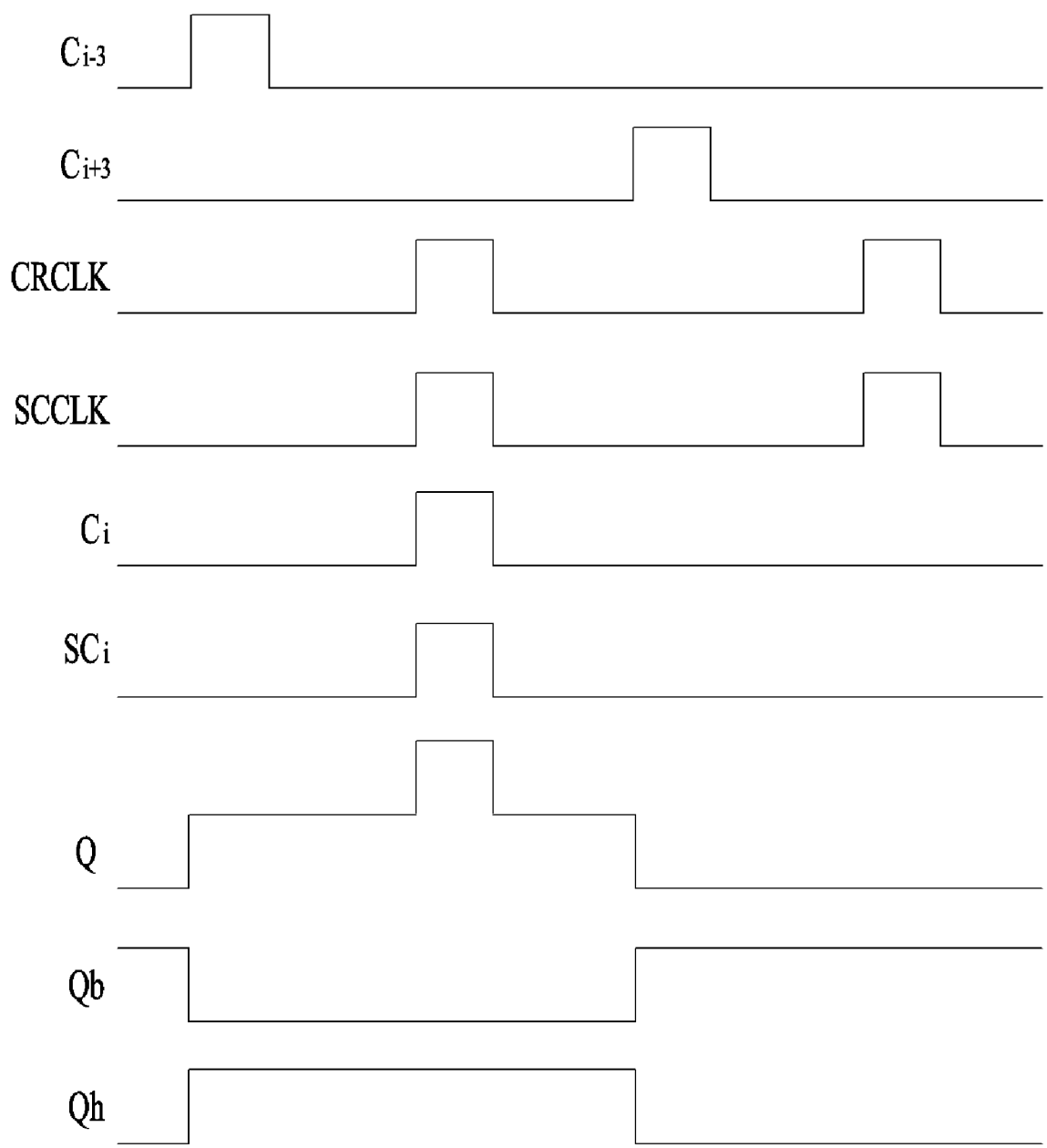
FIG. 4 is a diagram showing the operation waveform of an i-th stage of a display device according to an embodiment of the present invention.

FIG. 3 is a circuit diagram showing an i-th stage of a display device according to an embodiment of the present disclosure. FIG. 4 is a diagram showing the operation waveform of an i-th stage of a display device according to an embodiment of the present disclosure. Here, the i-th stage may be one of the top dummy stages TDT1 to TDTm, the main stages ST1 to STn or the bottom dummy stages BDT1 to BDTm. The i-th stage, as shown in FIG. 3, has a first output terminal SCi that is connected to a scan line or a dummy line, depending on whether the i-th stage is a main stage or a dummy stage. Additionally, the i-th stage has a second output terminal Ci connected to the i-th carrier line.

Referring to FIGS. 1 to 4, operation of each stage according to embodiments of the present disclosure will be described. First, when a high-level signal is applied through an (i−3)-th carrier line Ci−3 connected to an output terminal of an (i−3)-th stage, e.g., the second output terminal of the (i−3)-th stage, the Q-node charge transistors T1 and T1A may be turned on, so that the Q node may be charged. At this time, since pull-up transistors T6 and T6cr, which are connected to the second output terminal Ci and the first output terminal SCi, respectively, are turned on by the charged Q node. Since the clock signals CRCLK and SCCLK applied to the source terminals of the pull-up transistors T6 and T6cr have a low level, the output terminals of the stages may output a low-level signal. That is, a low-level signal is provided at the first output terminal SCi connected to the scan line or dummy line, and a low-level signal is provided at the second output terminal Ci connected to the carrier line. In addition, even when the signal applied through the (i−3)-th carrier line Ci−3 is changed to a low level, since the signal applied through the (i+3)-th carrier line Ci+3 connected to the (i+3)-th stage is maintained at a low level and a first low voltage GVSS1 is supplied to a Qb node by the charged Q node, Q-node discharge transistors T3, T3A, T3n and T3 nA are all turned off and the charge state of the Q node may be maintained.

In this state, when high-level clock signals CRCLK and SCCLK are applied to the source terminals of the pull-up transistors T6 and T6cr, the voltage of the Q node may be boosted and the first and second output terminals SCi, Ci of the stage may output high-level carrier signals and scan signals, respectively.

Subsequently, when the high-level signal is applied through the (i+3)-th carrier line Ci+3, the Q-node discharge transistors T3n and T3nA may be turned on, so that the Q node may be connected to a second low-voltage terminal GVSS2, thereby the Q node may be discharged. At this time, the pull-up transistors T6 and T6cr may be turned off by the discharged Q node and the Qb node may be connected to a high-voltage terminal GVDD to be charged. Pull-down transistors T7 and T7cr may be turned on by the charged Qb node and thus the first and second output terminals SCi, Ci may be connected to the low-voltage terminals GVSS0 and GVSS2. Therefore, even when the high-level clock signals CRCLK and SCCLK are applied to the source terminals of the pull-up transistors T6 and T6cr for other stages, a low-level signal may be output through the output terminal of the corresponding stage.

Figure 5:
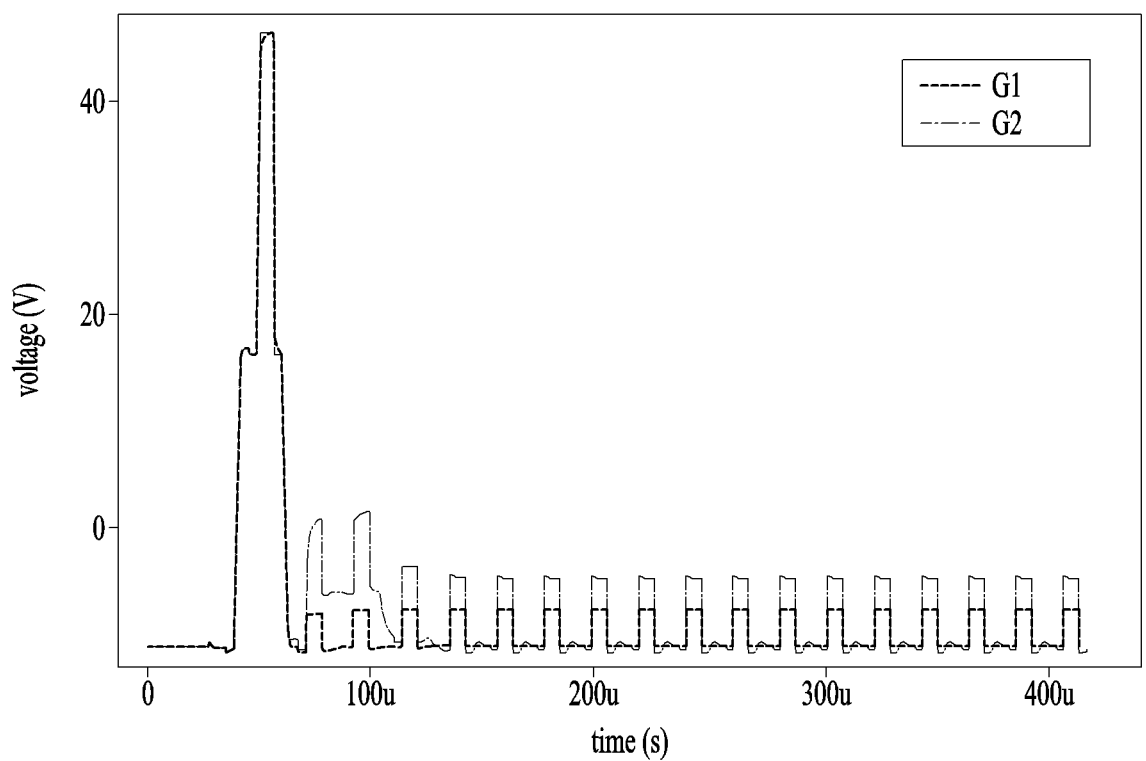
FIG. 5 is a graph showing ripple of a Q node in a dummy stage with passage of time.

FIG. 5 is a graph showing ripple of a Q node with passage of time in a dummy stage G1 in which load is applied to an output terminal, and a dummy stage G2 in which load is not applied to an output terminal. Load is applied to the output terminal in the dummy stage G1, for example, due to the dummy line connected to the output terminal, which may have a parasitic capacitance between the dummy line and one or more intersecting data lines.

Referring to FIG. 5, it can be seen that ripple of a relatively low level is generated in the Q node of the dummy stage G1 in which load is applied to the output terminal. That is, in the display device according to one or more embodiments of the present disclosure, since load is applied to the output terminals of the dummy stages by the dummy lines, ripple generated in the Q nodes of the dummy stages may be reduced.

When the level of ripple generated in the Q nodes of the dummy stages is reduced, leakage current generated by the pull-up transistor or the pull-down transistor may be reduced. Therefore, current accumulated in the Q nodes of the main stages may be reduced by the dummy stages. Thus, relatively large current may be accumulated before multiple outputs are generated in the Q nodes of the main stages.

Accordingly, the display device according to embodiments of the present disclosure may reduce the level of ripple generated in the Q nodes of the dummy stages, so that the current margin accumulated in the Q nodes of the main stages may be increased, thereby delaying multiple outputs due to ripple generated in the Q nodes of the main stages.

Figure 6:
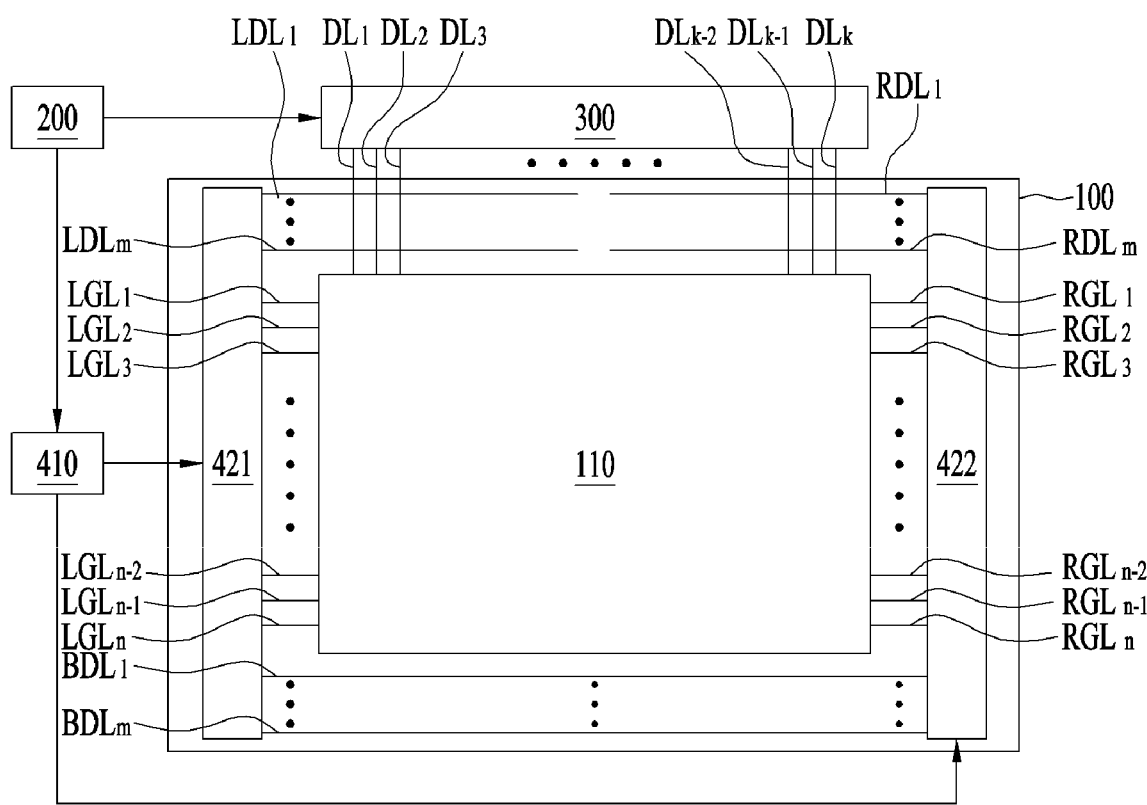
FIG. 6 is a schematic diagram showing a display device according to an alternative embodiment of the present disclosure.

The display device according to one or more embodiments of the present disclosure has been described as having the top dummy lines TDL1 to TDLm located between the display region 110 and the data driver 300, intersecting the data lines DL1 to DLk, and connected to the first scan driver 421 and the second scan driver 422. However, as shown in FIG. 6, the display device according to another embodiment of the present disclosure may include first top dummy lines LDL1 to LDLm connected to the first scan driver 421 and intersecting at least one of data lines DL1 to DLk, and second top dummy lines RDL1 to RDLm connected to the second scan driver 422 and intersecting at least one of the data lines DL1 to DLk. The length of first top dummy lines LDL1 to LDLm and the length of the second top dummy lines RDL1 to RDLm may be less than that of the bottom dummy lines BDL1 to BDLm. For example, each of the top dummy lines LDL1 to LDLm and RDL1 to RDLm may extend only partially between the first and second scan drivers 421, 422, as shown. This is in contrast to the embodiment shown in FIG. 1, in which each of the top dummy lines TDL1 to TDLm are connected to, and extend between, both of the first and second scan drivers 421, 422. As shown in FIG. 6, each of the dummy lines BDL1 to BDLm may be connected to, and extend between, both of the first and second scan drivers 421, 422, and thus have a longer length than that of the top dummy lines LDL1 to LDLm and RDL1 to RDLm.

The second top dummy lines RDL1 to RDLm may be located side by side with the first top dummy lines LDL1 to LDLm. For example, the end portion of each of the second top dummy lines RDL1 to RDLm may face that of each of the first top dummy lines LDL1 to LDLm, and the facing first and second top dummy lines may be aligned with one another, as shown. The end portions of the first top dummy lines LDL1 to LDLm and the end portions of the second top dummy lines RDL1 to RDLm may be disposed between the data lines DL1 to DLk. That is, each of the first top dummy lines LDL1 to LDLm and the second top dummy lines RDL1 to RDLm may terminate at respective locations on the display panel 100 that are between a first data line DL1 and a last data line DLk.

The display device according to another embodiment of the present disclosure may have parasitic capacitance caused by at least one of the data lines DL1 to DLk intersecting the first top dummy lines LDL1 to LDLm and the second top dummy lines RDL1 to RDLm. Therefore, in the display device according to one or more embodiments of the present disclosure, load by the first top dummy lines LDL1 to LDLm may be applied to the output terminals of the top dummy stages of the first scan driver 421, and load by the second top dummy lines RDL1 to RDLm may be applied to the output terminals of the top dummy stages of the second scan driver 422. Thus, the dummy lines LDL1 to LDLm and RDL1 to RDLm located between the display region 110 and the data driver 300 may be arranged in consideration of the other signal lines.

Figure 7:
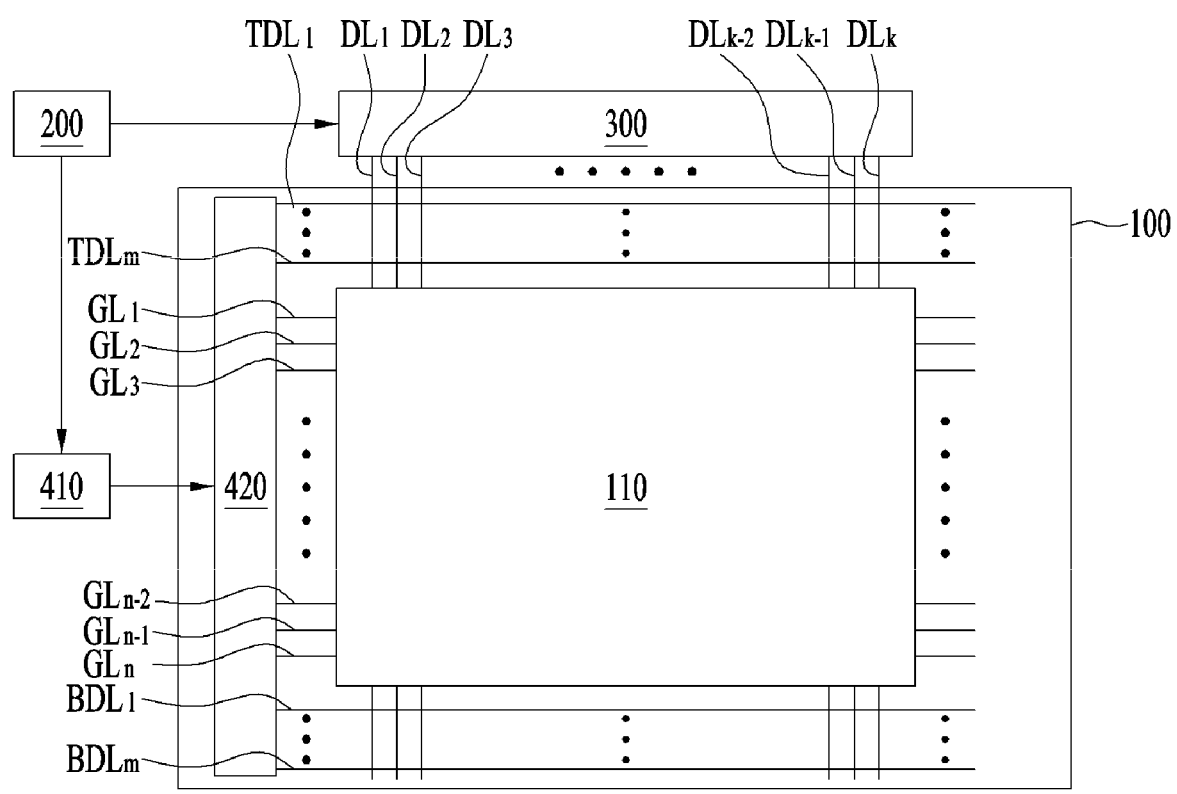
FIG. 7 is a schematic diagram showing a display device according to another alternative embodiment of the present disclosure.

As shown in FIGS. 1 and 6, display devices according to embodiments of the present disclosure may include two scan drivers 421 and 422. However, as shown in FIG. 7, a display device according to another embodiment of the present disclosure may include one integrated type scan driver 420. Moreover, in the display device shown in FIG. 7, the bottom dummy lines BDL1 to BDLm may intersect the data lines DL1 to DLk. For example, the display device may include data lines DL1 to DLk that completely traverse the display region 110. The data lines DL1 to DLk may further extend beyond the display region 110, and into the lower region of the display panel 110, where they intersect the bottom dummy lines BDL1 to BDLm.

The display device according to the various embodiments of the present disclosure may reduce ripple of the Q node in at least one dummy stage of the integrated type scan driver. Thus, in the display device according to the embodiment of the present disclosure, multiple outputs caused by ripple of the Q node may be delayed in the main stages using the output signal of the dummy stage as a start signal or reset signal. As a result, in the display device according to the embodiment of the present disclosure, it is possible to improve reliability of the integrated type scan driver.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a display panel including a display region;
a data driver that supplies data signals to the display region;
data lines that connect the data driver to the display region;
a scan driver disposed on the display panel and having a plurality of main stages, a first dummy stage, and a second dummy stage, the scan driver sequentially supplies scan signals from the main stages to the display region;
scan lines that connect the main stages of the scan driver to the display region;
a first dummy line positioned outside of the display region adjacent to a first side of the display region, the first dummy line connected to the first dummy stage of the scan driver, the first dummy line intersects at least one of the data lines; and
a second dummy line positioned outside of the display region adjacent to a second side of the display region that is opposite the first side, the second dummy line connected to the second dummy stage of the scan driver,
wherein the first dummy stage supplies a start signal to at least one of the main stages, and the second dummy stage supplies a reset signal to at least one of the main stages.

2. The display device according to claim 1, wherein the first dummy line is disposed in parallel to the scan lines.

3. The display device according to claim 2, wherein the first dummy line is positioned between the display region and the data driver.

4. The display device according to claim 1, wherein a length of the first dummy line is different from that of the scan lines.

5. The display device according to claim 4, wherein the first dummy line includes an end portion disposed between the data lines.

6. The display device according to claim 1,
wherein the first dummy line and the second dummy line are disposed in parallel to the scan lines, and
wherein the data lines extend through the first side of the display region to at least the second side.

7. The display device according to claim 6, wherein the data lines extend past the second side of the display region, and the second dummy line intersects at least one of the data lines.

8. A display device, comprising:
a display panel including a display region;
a data driver connected to the display region by data lines, the data driver positioned adjacent to a first side of the display region;
a first scan driver on the display panel and positioned adjacent to a second side of the display region, the first scan driver including a first plurality of main stages, first top dummy stages configured to supply a start signal to at least one of the main stages of the first scan driver, and first bottom dummy stages configured to supply a reset signal to at least one of the main stages of the first scan driver, the first scan driver connected to the display region by first scan lines;
a second scan driver on the display panel and positioned adjacent to a third side of the display region that is opposite to the second side, the second scan driver including a second plurality of main stages, second top dummy stages configured to supply a start signal to at least one of the main stages of the second scan driver, and second bottom dummy stages configured to supply a reset signal to at least one of the main stages of the second scan driver, the second scan driver connected to the display region by second scan lines;
at least one first dummy line outside the display region and positioned adjacent to a fourth side of the display region that is opposite to the first side, the at least one first dummy line extending between and connected to at least one of the first bottom dummy stages of the first scan driver and at least one of the second bottom dummy stages of the second scan driver; and
at least one top dummy line outside the display region and positioned between the data driver and the first side of the display panel, the at least one top dummy line connected to at least one of the first top dummy stages of the first scan driver or the second top dummy stages of the second scan driver.
wherein the first scan lines are connected to the main stages of the first scan driver, and the second scan lines are connected to the main stages of the second scan driver.

9. The display device according to claim 8, wherein the data lines extend through the display region beyond the fourth side, and the at least one first dummy line intersects at least one of the data lines.

10. The display device according to claim 8, wherein the at least one top dummy line includes:
at least one second dummy line connected to at least one of the first top dummy stages of the first scan driver and positioned between the data driver and the first side of the display panel, the at least one second dummy line intersects at least one data line; and
at least one third dummy line connected to at least one of the second top dummy stages of the second scan driver and positioned between the data driver and the first side of the display panel, the at least one third dummy line intersects at least one data line.

11. The display device according to claim 10, wherein the at least one second dummy line and the at least one third dummy line intersect different data lines.

12. The display device according to claim 10, wherein the at least one second dummy line and the at least one third dummy line are disposed in parallel to the scan lines outside the display region.

13. The display device according to claim 12, wherein the at least one second dummy line and the at least one third dummy line are aligned with each other.

14. The display device according to claim 10, wherein the at least one second dummy line includes a plurality of second dummy lines, the at least one third dummy line includes a plurality of third dummy lines, and a number of the second dummy lines is equal to a number of the third dummy lines.

15. The display device according to claim 14, wherein the at least one first dummy line includes a plurality of first dummy lines, and a number of the first dummy lines is equal to the number of second dummy lines and the number of third dummy lines.

16. The display device according to claim 14, wherein the second dummy lines are aligned with corresponding ones of the third dummy lines.

\* \* \* \* \*